United States Patent [19]
Thomas

[11] Patent Number: 6,041,223
[45] Date of Patent: Mar. 21, 2000

[54] HIGH LEVEL DIODE MIXER

[75] Inventor: Robert McLaren Thomas, Nepean, Canada

[73] Assignee: Nortel Networks Corporation, Montreal, Canada

[21] Appl. No.: 09/048,072

[22] Filed: Mar. 26, 1998

[51] Int. Cl.[7] ................................................. H04B 1/26
[52] U.S. Cl. ...................... 455/326; 455/323; 455/330; 327/113
[58] Field of Search .................................... 455/326, 323, 455/330, 333; 327/113, 329, 327, 356, 359

[56] References Cited

U.S. PATENT DOCUMENTS

| | | | |
|---|---|---|---|
| 3,665,508 | 5/1972 | Gawler ..................................... | 325/446 |
| 4,385,401 | 5/1983 | Jagnow et al. ........................... | 455/325 |
| 4,590,616 | 5/1986 | van Glabbeek .......................... | 455/319 |
| 5,060,299 | 10/1991 | Enderson ................................ | 455/326 |
| 5,697,091 | 12/1997 | Hirschenberger et al. ............. | 455/318 |
| 5,752,181 | 5/1998 | Vice ....................................... | 455/326 |
| 5,809,410 | 11/1998 | Stuebing et al. ........................ | 455/333 |

OTHER PUBLICATIONS

"Amplitude Modulation"—Communication Circuits; Analysis and Design, Kenneth K. Clarke, Donald T. Hess; Clarke–Hess Communications Research Corporation; Addison–Wesley Publishing Company; Reading Massachusetts, 1971.

"Methods of Amplitude Modulation"—Electronics Designers' Handbook, 2nd Edition, McGraw Hill; Landee R.W., Davis D.C., Albrecut, A.P. 1977.

"Superheterodyne Techniques"—Electronics Designers' Handbook, 2nd Edition, McGraw Hill, Landee R.W., Davis D.C., Albrecut, A.P. 1977.

Mini–Circuits, Section 1, entitled "Frequency Mixers", pp. 1–1 to 1–9.

*Primary Examiner*—Dwayne D. Bost
*Assistant Examiner*—Raymond B Persino
*Attorney, Agent, or Firm*—Gowling, Strathy & Henderson; T. Gary O'Neill

[57] ABSTRACT

A double balanced mixer consisting of two complementary solid state switches, with a high reverse-bias voltage provided by isolating the sides of the complementary solid state switches receiving the carrier signal from one another, and connecting the other sides together. If the solid state switches are designed to couple the input signal to the output signal in response to the carrier signal having an amplitude of zero volts, then a solid state switch in forward-bias will have a potential of zero volts on both sides of it. While this solid state switch is in forward-bias, the second solid state switch will be receiving the complementary carrier signal on one side, which is a high positive voltage, and zero volts on the side connected to the first solid state switch. The second solid state switch will therefore see a reverse-bias potential difference equal to the potential difference between the positive voltage of the complementary carrier signal and zero volts.

17 Claims, 5 Drawing Sheets

HIGH LEVEL DIODE MIXER

The present invention relates generally to diode mixers, and more specifically, to a double balanced diode mixer circuit and local oscillator design which applies a high voltage to diodes in reverse-bias.

BACKGROUND OF THE INVENTION

The best mixers for many applications are diode ring mixers. Transistors and field-effect transistors may also be used as semiconductor switches in mixer designs, but require more components to drive them, and introduce more design complications.

Referring to FIGS. 1a, 1b, 1c, 1d and 1e the process of modulation, as known in the art, is described. FIG. 1a identifies a continuous signal, $f_O$, on amplitude and time axes, and FIG. 1b represents a carrier signal, $f_{LO}$, on the same axes. Mixing these two signals together, also known as modulating or heterodyning, results in the modulated signal shown as $f_{MOD}$ in FIG. 1d. The modulated signal, $f_{MOD}$, has the frequency of the carrier signal, $f_{LO}$, and the amplitude of the continuous signal, $f_O$.

Although this example will be explained with respect to an input signal, $f_O$, composed of a single frequency, it is understood that the process applies in the same manner to signals with either multiple frequencies, or complete spectra of frequencies. The theory of upper and lower sidebands, for example, is known in the art and will not be reviewed herein.

Diode mixers are one of a group of semiconductor switching mixers called "chopper" mixers. These mixers couple or "chop" segments of the continuous input signal to the output in time with the carrier frequency, and do not allow the remainder of the continuous input signal to pass to the output. A semiconductor switch which is biased to couple the continuous signal to the output when the carrier frequency $f_{LO}$ has a positive magnitude would provide an output as shown in FIG. 1c. During each positive half-cycle of the carrier frequency, $f_{LO}$, the semiconductor switch will allow the continuous signal to pass to the output, giving an output signal S(t).

As an electromagnetic signal is composed of sinusoidal waves, these segments will be composed of sinusoids at a fundamental frequency and smaller amplitude sinusoids at harmonic frequencies of the fundamental. In addition to the fundamental and harmonic signal components, the non-linearities of chopper mixers in the prior art also produce intermodulation products. These intermodulation products consume signal power and may interfere with the target signals.

The process described thus far is for a single mixer. A double balanced mixer has a second semiconductor switch, which chops and inverts complementary segments of the continuous input signal, as shown in FIG. 1e. These inverted segments have the same sinusoid pattern as the output of the single mixer, resulting in a more powerful output signal.

Modulation is used in basically the same manner as described above in a broad range of applications: televisions, microwave communications and spectrum analysers, as well as modulating radio frequency (RF) signals into intermediate frequency (IF) signals in radio receivers.

A circuit for performing such double mixing, as known in the art, is shown in FIG. 2. This diode ring mixer circuit 10 has an input for a continuous signal 12, an input for a local oscillator signal 14, an output for a modulated signal 16, a signal transformer 18, a local oscillator transformer 20, and four diodes 22, 24, 26, and 28.

The local oscillator input 14, local oscillator transformer 20 and diodes 22, 24, 26, and 28 alternately couple one end of the primary winding of the signal transformer 18 to ground, and then the other. This allows the input 12 to alternately conduct through upper and lower halves of the primary winding of the signal transformer 18. This gives a chopping and an inverted chopping of the input signal 12 as described with respect to FIGS. 1a, 1b, 1c, 1d and 1e above.

The local oscillator components cause this chopping by alternately forward-biasing diode pair 22 and 24, and diode pair 26 and 28. Or put another way, the local oscillator components cause the diodes to act as switches. During a positive half cycle of the local oscillator at input 14, a corresponding positive half cycle would pass through the local oscillator transformer 20, and create a positive potential difference across points A and C of the mixer 10. This positive potential difference would cause diodes 26 and 28 to be forward-biased, thus conducting, and diodes 22 and 24 to be reverse-biased, thus non-conducting.

With diodes 26 and 28 conducting, two circuits are completed. Because diodes 26 and 28 are conducting and balanced to the grounded center tap of the local oscillator transformer 20, point B is essentially at ground potential. Firstly, the circuit of the local oscillator signal from both halves of the secondary of the local oscillator transformer 20 is completed to the ground potential at point B. Since this circuit is complete, the local oscillator signal does not pass through to the signal transformer 18. Secondly, with point B at ground potential, the input signal from input 12 can flow through the lower half of the signal transformer 18 to ground, coupling the continuous signal input 12 to the output 16, and allowing a segment of the continuous input signal to pass through the signal transformer 18 to the output 16 without phase reversal. With both diodes 26 and 28 in forward-bias, the continuous signal current from input 12, flows to ground via the two halves of the secondary winding of the local oscillator transformer 20 in opposite directions, so there is no net magnetization of the local oscillator transformer 20 core, and the transformer 20 offers no impedance to the signal.

Similarly, during a negative half cycle of the local oscillator at input 14, a corresponding negative half cycle would pass through the local oscillator transformer 20, and cause a negative potential difference across points A and C of the mixer 10. This negative potential difference would cause diodes 22 and 24 to be in forward-bias, thus conducting, and diodes 26 and 28 to be in reverse-bias, thus non-conducting.

With diodes 22 and 24 conducting, again two circuits are completed. Firstly, the local oscillator signal from the secondary of the local oscillator transformer 20 is completed, and the local oscillator signal does not pass through to the signal transformer 18. Secondly, as described above, with diodes 22 and 24 now behaving as closed circuits, point D is essentially at ground potential. With point D at ground potential, the input signal 12 can flow through the upper half of the signal transformer 18 to ground, causing an inverted segment of the input signal from input 12 to pass through the signal transformer 18 to the output 16.

In this way, the input signal is modulated as described with respect to FIGS. 1a, 1b, 1c, 1d and 1e. The problem with this circuit is that when either pair of diodes is forward-biased, the voltage drop across A and C will be limited to the voltage drop across the forward-biased diode pair plus the amplitude of the input signal 12, or $V_s$.

Therefore, the reverse-bias voltage applied to the non-conducting diode pair will be limited to that drop across the forward-biased diode pair plus $V_s$. With typical Schottky signal diodes, this is about 400 mV±$V_s$. Because 400 mV is not a great deal larger than the input signal $V_s$, even small variances in the input signal $V_s$ will cause intermodulation products to be generated and output at 16. It is believed that the dominant mechanisms are that junction capacitance and reverse leakage of the diodes are non-linear functions of voltage.

If these intermodulation products fall inband, they may degrade the output signal itself, or if they fall out of band, they may appear as spectral spreading or interfere with other signals. These effects are typically important considerations in the design of transmitters and receivers for use in wireless systems or CATV modems.

In Frequency Division Multiple Access systems (FDMA), for example, a receiver may wish to listen to a distant transmitter in one channel, but be overwhelmed by intermodulation products produced by a nearby transmitter radiating in an adjacent channel. This is known as the "near-far" problem.

In Code Division Multiple Access systems (CDMA), methods are known to reduce the effect of noise created by intermodulation products, but such methods require overheads of transmitted code sequences or computational analysis of timing, carrier phase, or other parameters. The greater the noise level, the greater the overhead necessary to compensate. Reducing the noise level allows for reduced compensatory overheads and higher efficiency.

In receivers, front end components such as preselection filters, attenuators, and front-end Automatic Gain Control (AGC) systems are needed to protect mixers from excessive signal levels. Receivers may also pick up noise in out of band frequencies and inadvertently create intermodulation products of that noise which fall inband. In transmitters, the ability to operate at higher signal levels can permit a wider choice of architectures.

Emerging demands to provide data transmission over existing coaxial cable infrastructures currently carrying television signals, and existing twisted pair infrastructures currently carrying voice telephone services, require digital modems with greater speed and reduced noise levels. An improved mixer design would allow digital modems to operate at higher speeds with less overhead to compensate for noise levels.

There is therefore a need for a double balanced diode mixer which provides reduced levels of intermodulation products. This design must be provided with consideration for the cost of electrical components, circuit manufacturing and physical board area.

SUMMARY OF THE INVENTION

It is therefore an object of the invention to provide an improved double balanced high level diode mixer circuit which applies a high voltage to diodes in reverse-bias, resulting in a reduced level of intermodulation products.

One aspect of the invention is broadly defined as a double balanced mixer circuit for mixing a first input signal with a second input signal oscillating between a positive voltage and a zero voltage at a higher frequency than the first signal, and providing an output signal comprising a first solid state switching means for receiving the first input signal and the second input signal and transmitting the output signal, responsive to the second input signal having an amplitude of zero volts by being by forward-biased, and coupling the first input signal to the output signal; a second solid state switching means for receiving the first input signal and the second input signal and transmitting the output signal, responsive to a complement of the second input signal having an amplitude of zero volts by being forward-biased, and coupling an inversion of the first input signal to the output signal; and means for electrically interconnecting the first solid state switching means with the second solid state switching means so that either one of the first or the second solid state switching means being in a forward-bias state provides a low voltage potential to the other of the solid state switching means against which the other of the solid state switching means becomes reversed-bias with respect to the positive voltage.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

The invention reduces the level of intermodulation products created by diode non-linearities in diode ring mixers, by providing a high voltage level to the diodes in reverse-bias.

As a double balanced mixer consists of two complementary solid state switches, a high reverse-bias voltage can be obtained by isolating the sides of the complementary solid state switches receiving the carrier signal from one another, and connecting the other sides together. If the solid state switches are designed to couple the input signal to the output in response to the carrier signal having an amplitude of zero volts, then a solid state switch in forward-bias will have a potential of zero volts on one side, and a potential equal to the forward-bias voltage drop, $V_d$, on the other side. While this solid state switch is in forward-bias, the second solid state switch will be receiving the complementary carrier signal on one side, which is a high positive voltage, and $V_d$ volts on the side connected to the first solid state switch. The second solid state switch will therefore see a reverse-bias potential difference equal to the potential difference between the positive voltage of the complementary carrier signal and $V_d$ volts. With this high reverse voltage across the reverse-biased diodes, smaller levels of intermodulation products will be created by variations in the input signal, $V_s$, than mixers in the prior art.

Figure 3A:
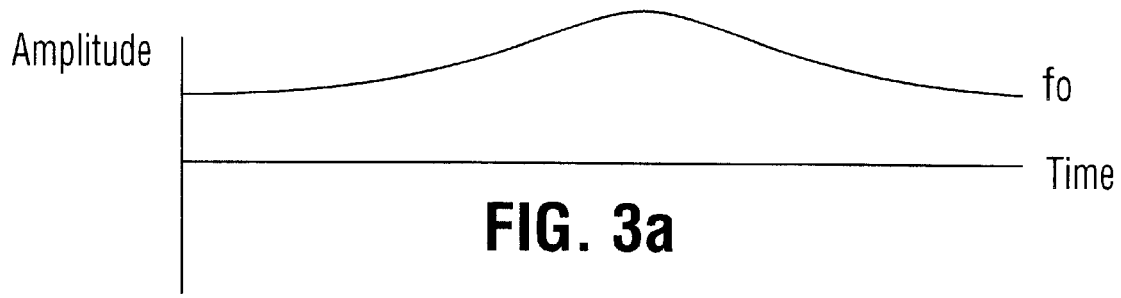
FIGS. 3*a*, 3*b*, 3*c* and 3*d* are graphs of amplitude versus time for a typical signal, demonstrating operation of a balanced diode mixer in an embodiment of the invention.
Figure 3B:
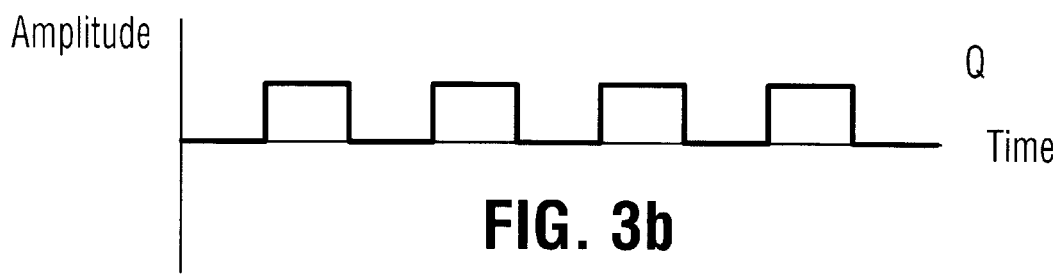

Referring to FIGS. 3*a*, 3*b*, 3*c* and 3*d*, graphs of amplitude versus time for a typical signal are shown, demonstrating operation of a diode mixer in an embodiment of the invention. FIG. 3*a* presents a continuous signal, $f_O$, on amplitude and time axes. FIG. 3*b* represents a square wave carrier signal, Q, in a manner of the invention, on the same axes.

Figure 3C:
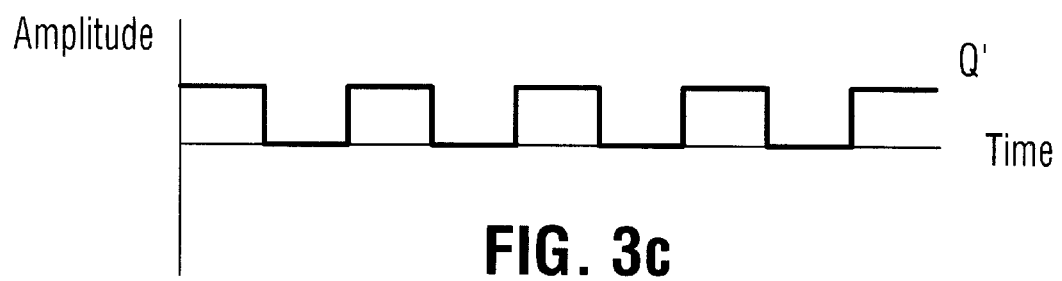
Figure 3D:
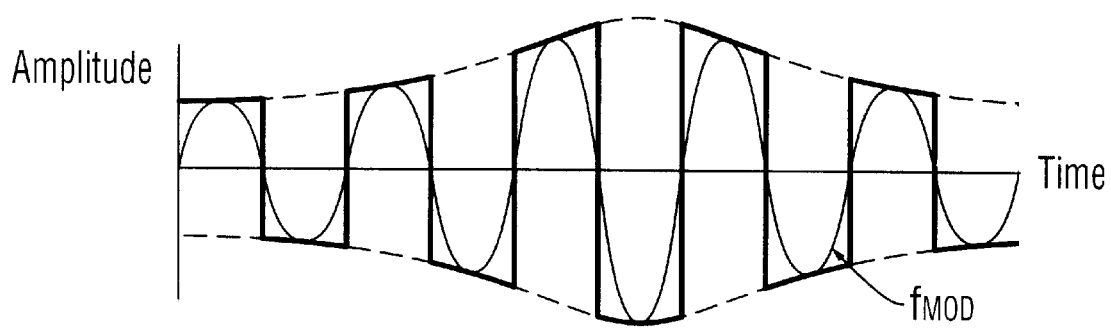

The complement of Q, a square wave with 180° phase reversal, is represented as Q' in FIG. 3c. Mixing the continuous signal $f_O$, using a single mixer switched with carrier signal Q and a second single inverted mixer switched with its complement Q', results in the modulated signal shown as $f_{MOD}$ in FIG. 3d. The modulated signal, $f_{MOD}$, has the frequency of the carrier signal, Q, and the amplitude of the continuous signal, $f_O$.

As noted in the example of FIGS. 1a, 1b, 1c, 1d and 1e, the invention will be described with respect to an input signal, $f_O$, composed of a single frequency. It is understood that the process of the invention applies in the same manner to signals composed of either multiple frequencies or complete spectra of frequencies, including upper and lower sidebands.

When a local oscillator is being used to provide one of the mixing signals, a local oscillator generating square waves results in more rapid switching between the forward- and reverse-biased states of the diodes than provided by a sinusoidal wave as known in the art. This results in less insertion loss, interference and noise.

Figure 4:
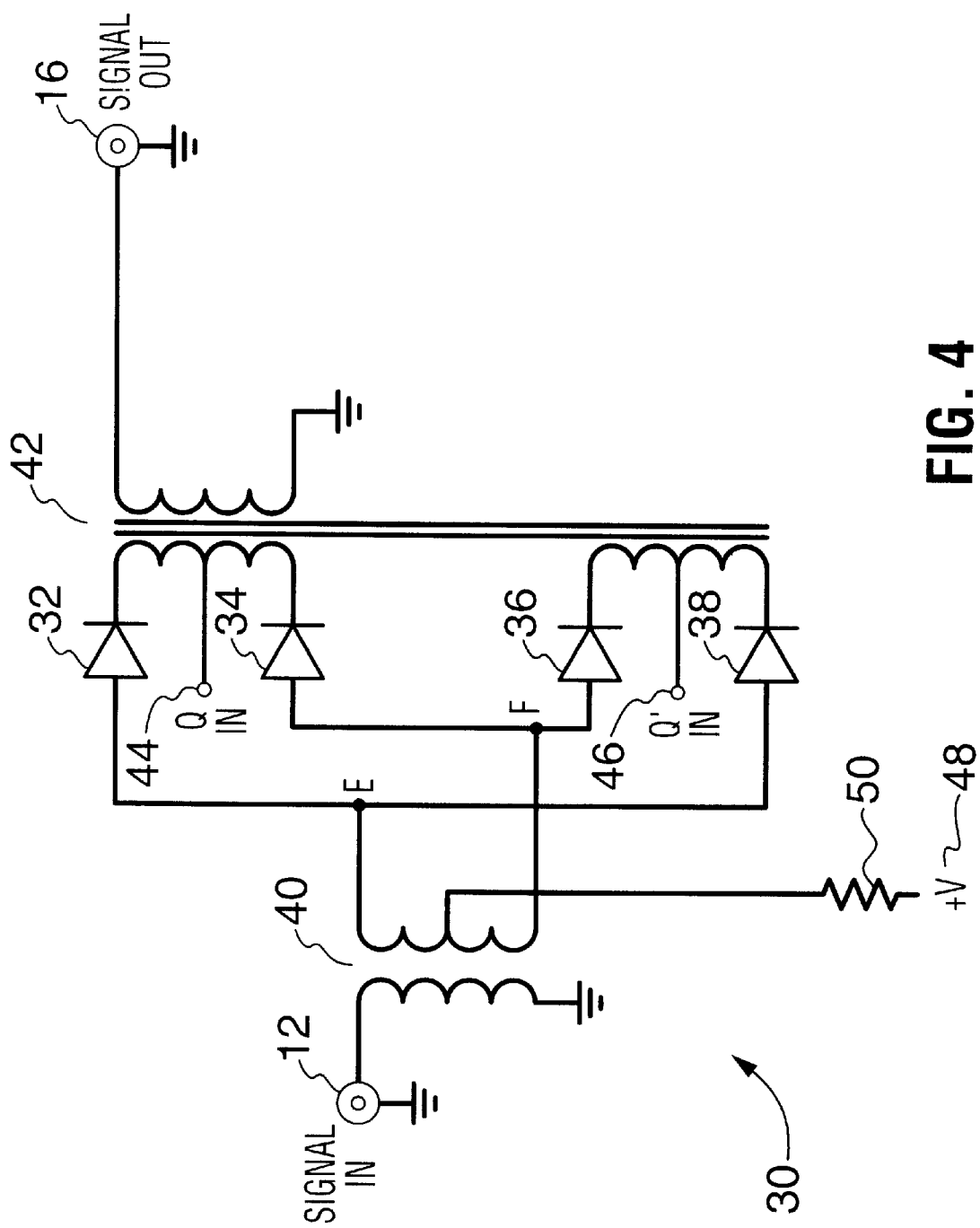
FIG. 4 is a double balanced diode mixer with a single output transformer, in an embodiment of the invention.

Referring now to FIG. 4, a double balanced diode mixer 30 in an embodiment of the invention is presented. This double balanced diode mixer 30 has many of the same components as the ring mixer shown in FIG. 2, but broadly speaking, there are two major differences. Firstly, in FIG. 2, the diode ring was being used to alternately bias one end of the output transformer 18 to ground, completing a circuit to ground from the continuous signal input 12, through half of the primary winding of the output transformer 18. In the mixer 30 in an embodiment of the invention, the diode pairs 32, 34, 36 and 38, are being biased to allow the input signal to pass from the signal input 12 through the input transformer 40 and output transformer 42 to the output 16. Secondly, in the diode mixer 10 in FIG. 2, the forward-bias of one diode pair limited the reverse-bias voltage of the other diode pair as both pairs were electrically connected together. In the mixer 30 in an embodiment of the invention, one side of each diode pair is connected together, but the other side is isolated. This arrangement allows us to obtain a high reverse voltage by having the isolated side of the reverse-biased diodes at high potential, while using the forward-biased diodes to create a low, near ground, potential on the other side. This will be discussed in greater detail below.

The local oscillator is isolated from the input and output signals because its circuit is completed by the secondary winding of the input transformer 40 and the primary windings of the output transformer 42. That is, when the oscillator amplitude is the same as +V, there is no potential difference, and no current flows. When the oscillator amplitude is zero volts, there is a potential difference of +V volts.

FIG. 4 presents an electrical schematic of a double balanced mixer circuit in an embodiment of the invention. It includes an input 12 for receiving a continuous input signal, an input 44 for receiving a square wave signal oscillating between zero volts and a positive voltage (the local oscillator or carrier signal), an input 46 for receiving a complement of the square wave local oscillator signal, and an output 16, for transmitting the continuous signal modulated at the frequency of the carrier frequency of Q and Q'. Note that the local oscillator square wave signals Q and Q' must be at a higher frequency than the continuous signal received at input 12. There is also an input for a constant direct current (DC) voltage source 48. This constant voltage must be less than or equal to the peak voltage of the square waves Q and Q'. As noted above, this circuit also includes an input transformer 40 having a primary winding and a secondary winding with a balanced center tap, where the continuous signal input 12 is connected to the primary winding of the input transformer 40, and the constant DC voltage source 48 is connected to the center tap of the secondary winding of the input transformer 40, via a current limiting resistor 50. The output transformer 42 has two primary windings with center taps, and a secondary winding connected to the output 16. The center tap of one primary winding is connected to the Q signal input 44, and the center tap of the second primary winding is connected to the Q' signal input 46. The first diode pair 32 and 34, has cathodes connected to opposite ends of the secondary winding of the input transformer 40, and anodes connected to opposite ends of one primary winding of the output transformer 42. The second diode pair 36 and 38, also has cathodes connected to opposite ends of the secondary winding of input transformer 40, and anodes connected to opposite ends of the second primary winding of the output transformer 42.

As noted above, input signal Q is oscillating between between zero volts and a positive voltage. When signal Q has an amplitude of zero volts, diodes 32 and 34 will be conducting because the constant DC voltage input at 48, will create a potential difference to forward-bias diodes 32 and 34. Because the current will flow from the local oscillator input 44 through the two halves of the primary winding of output transformer 42 in opposite directions, Q does not create a net magnetization in the output transformer 42. With diodes 32 and 34 in forward-bias, the input signal from 12 is free to pass through the input transformer 40, through diodes 32 and 34, and through the first primary winding of the output transformer 42 to the output 16.

Also, with diodes 32 and 34 in forward-bias and signal Q at zero volts, points E and F will have a potential of $V_d \pm V_s$ with respect to ground, where $V_d$ is the forward-bias drop across a diode and $\pm V_s$ is the level of the input signal. When Q has an amplitude of zero volts, its complement, Q', will have a potential equal to the positive voltage, +V. With Q' having a positive voltage, and points E and F having a potential of $V_d \pm V_s$ with respect to ground, both diodes 36 and 38 will be in reverse-bias with a high reverse voltage equal to $+V - V_d \pm V_s$.

Conversely, when Q has a positive voltage, and Q' has a zero voltage, diodes 36 and 38 will be in forward-bias. This will allow the input signal from 12 to pass through the input transformer 40, through diode pair 36 and 38, and through the second primary winding of the output transformer 42 to the output 16. Because diodes 36 and 38 are in forward bias, the voltage potential at E and F is $V_d \pm V_s$ with respect to ground, so the voltage across the reverse-biased diodes 32 and 34 is high, reducing intermodulation products.

When either Q or Q' has a value of zero volts, current flows via resistor 50, through the secondary winding of input transformer 40, through the forward-biased diode pair, and through the respective primary winding of the output transformer 42.

There are two paths for the current to follow. For example, if Q input 44 is low, then diode pair 32 and 34 will be forward-biased, and one path will comprise current flowing from the DC voltage source at 48, through the current limiting resistor 50, through one half of the secondary winding of the input transformer 40, through point E, through diode 32, through one half of the first primary winding of the output transformer 42, to the Q input 44. The second path will comprise current flowing from the DC voltage source at 48, through the current limiting resistor 50, through the other half of the secondary winding of the input transformer 40, through point F, through diode 34, through the other half of the first primary winding of the output transformer 42, to the Q input 44.

Because the impedance of the two paths is balanced, the same amount of current will flow through each path, and hence, the same current will flow through each half of the secondary winding of input transformer 40. Since these halves are wound in opposite directions, there is no net magnetization of transformer 40.

Similarly, the same biasing current passes through both halves of the primary on the output transformer 42, so there is no net magnetization of the output transformer 42 due to the biasing current. As a result, only the input signal from 12 will pass through the input transformer 40, and the output transformer 42, to the output 16.

The important feature of the circuit in FIG. 4 is that when one semiconductor switch is forward-biased and the other reverse-biased, which is the case except during transition between states, the voltage at points E and F will be equal to $V_d \pm V_s$, where $V_d$ is the voltage drop across a diode, and $\pm V_s$ the input signal level. Therefore, the reverse voltage on the non-conducting diode pair will be $+V-V_d \pm V_s$, where +V is the constant DC voltage input at 48. With this high reverse voltage, the non-linearities of the diodes discussed above, are avoided, resulting in reduced level of intermodulation products.

Figure 1A:
FIGS. 1*a*, 1*b*, 1*c*, 1*d* and 1*e* are graphs of signals on amplitude versus time axes for a typical continuous signal, demonstrating operation of a double balanced diode mixer as known in the prior art.
Figure 1B:
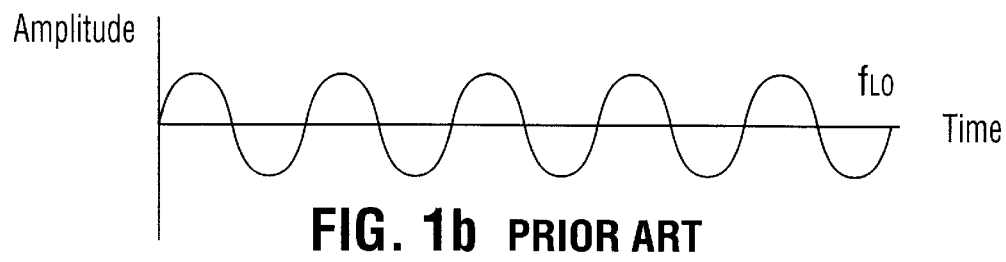
Figure 1C:
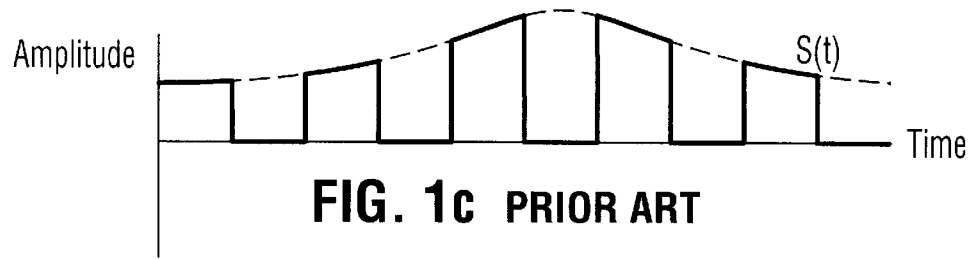
Figure 1D:
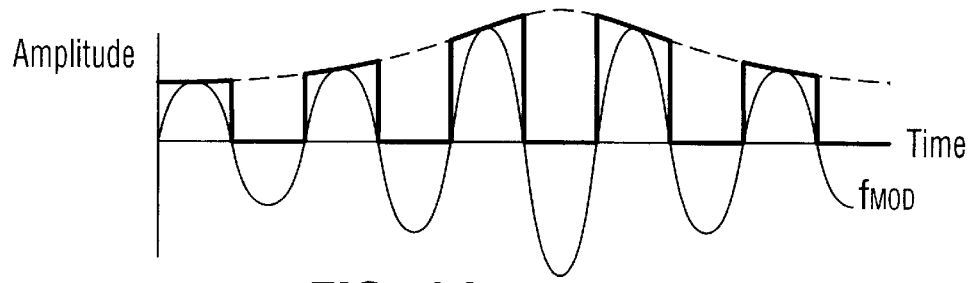
Figure 1E:
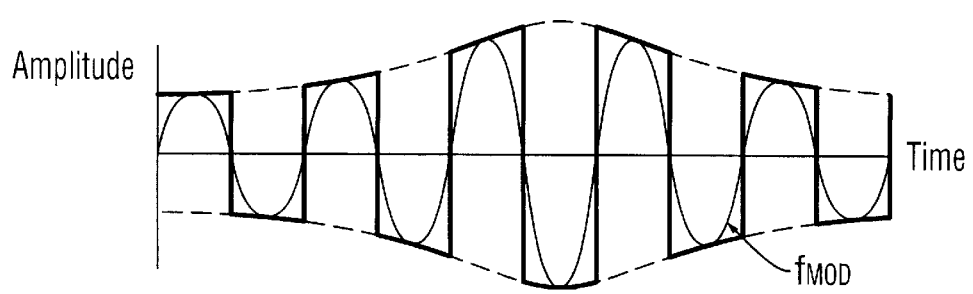
Figure 2:
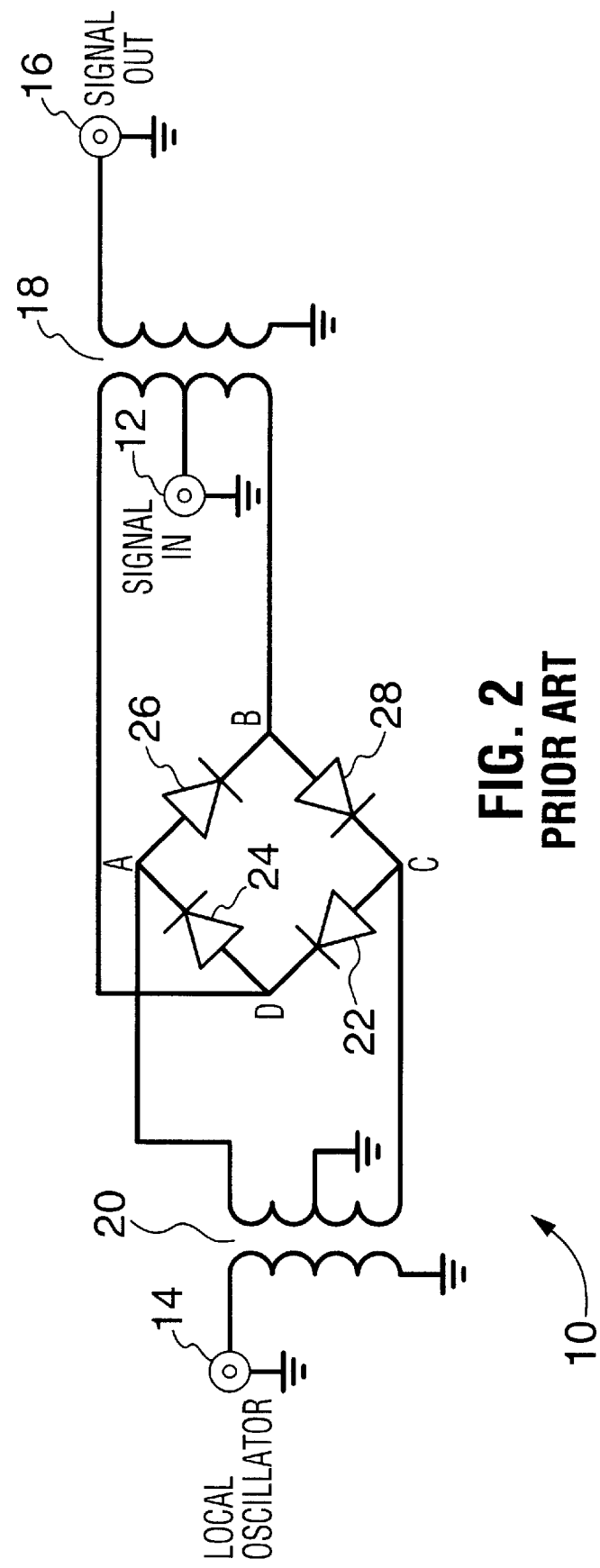
FIG. 2 is a double balanced diode mixer as known in the prior art.

This mixer design provides high reverse-bias voltage for minimal cost over the prior art. The only additional component of the mixer over the circuit in FIG. 2 is a single additional winding on the output transformer 42. This allows the circuit to be provided at almost the same component cost, with essentially no increase to circuit board area or assembly cost. Although this mixer appears to require a more sophisticated local oscillator, both the square wave oscillator and mixer circuit can be powered by a single Direct Current (DC) voltage source. Double balanced mixers in the prior art generally require a local oscillator varying between a negative and positive potential, requiring additional power supply components.

Figure 5:
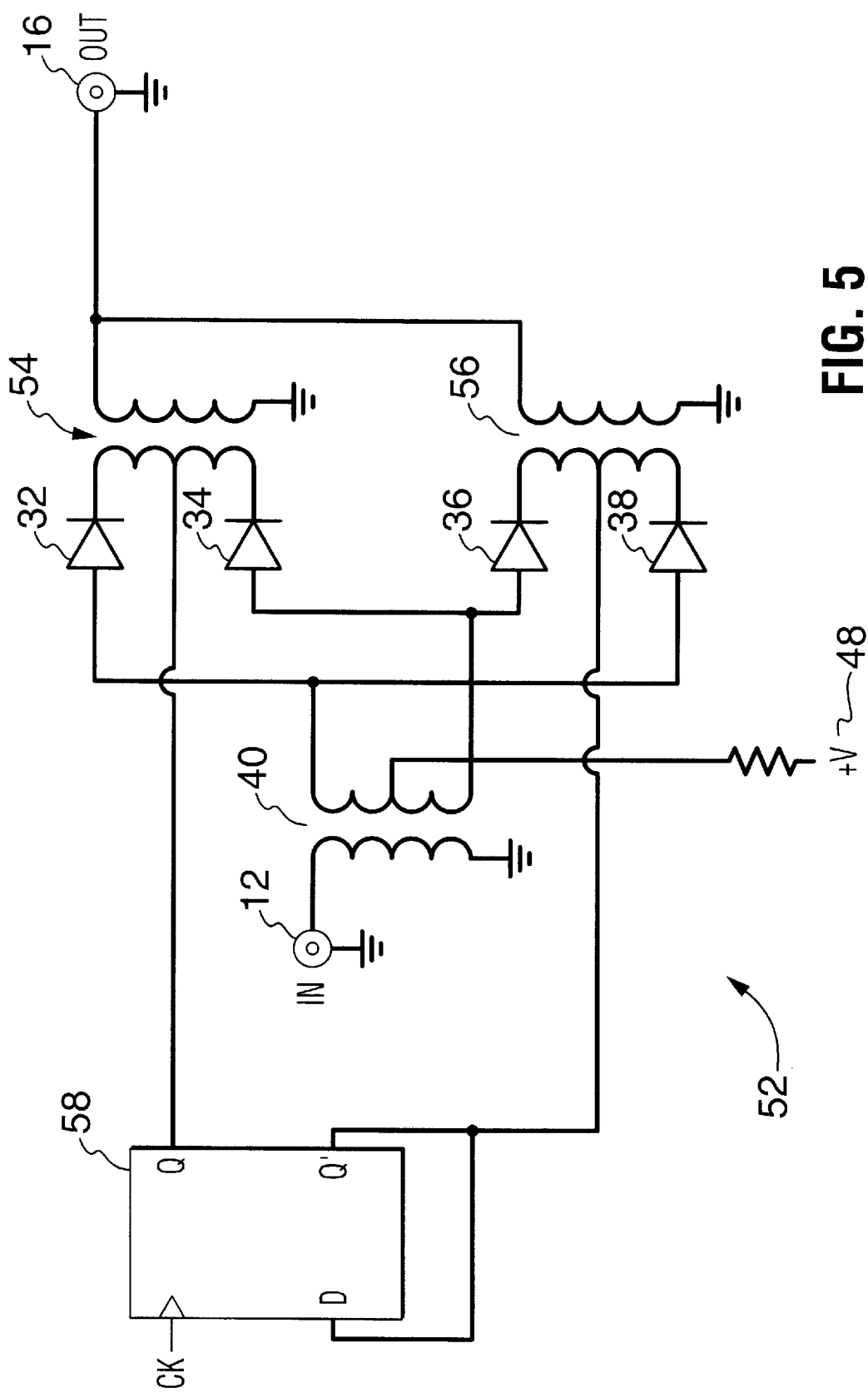
FIG. 5 is a double balanced diode mixer with two output transformers, in an embodiment of the invention.

FIG. 5 presents a preferred embodiment 52 of the same circuit as shown in FIG. 4. In this embodiment, the single output transformer 42 has been replaced with two output transformers 54 and 56, and a type-D flip-flop 58 has been used to provide the square wave Q and its complement Q'. It would be known by one skilled in the art that a variety of circuits could provide the square wave Q and its complement Q'.

A mixer circuit 52 as shown in FIG. 5 was prepared and tested using the following components:
1. Mini-Circuits TT1-6 transformers,
2. Motorola MBD-101 Schottky diodes, and
3. 74ACT74 type-D flip-flop.

The replacement of the single output transformer 42 used in FIG. 4, with two output transformers 54 and 56, has no impact on the operation of the circuit. The transformers used had a unity gain, that is, a winding ratio of 1:1, though one skilled in the art would know that any coordinated pairing could be used such as a 1:2 input transformer and a 2:1 output transformer. Even uncoordinated pairings could be used if allowance is made for the overall gain of the circuit, or if such gain is desired.

The selection of diodes would be made on the parameters of the mixer being designed. Such parameters would be known to one skilled in the art, and do not limit the breadth of the invention.

The type-D flip-flop 58 was used as a convenient means of providing a square wave Q and its complement Q', that is, two square wave signals 180° apart. Such signals could easily be provided by other means such as gated logic, operational amplifiers or transistor oscillators. Again, such methods are known in the art and do not limit the invention. The type-D flip-flop 58 was arranged as a divide by 2 counter oscillating at half the frequency of the clock input signal CK.

A single +5 volt power supply was used to power the type-D flip-flop 58, and to provide the constant DC voltage source at input 48. Because the type-D flip-flop 58 was powered by +5 volts, the square waves Q and Q' oscillated between zero volts and +5 volts. The reverse-bias of the diodes was therefore approximately +5 volts–400 mV, so the condition of a large reverse bias voltage was satisfied.

Operation is the same as described with respect to FIG. 4 above. When the type-D flip-flop 58 is in the RESET state, output Q is at 0 volts and diodes 32 and 34 are forward-biased and conduct. When the type-D flip-flop 58 is in the SET state, output Q is at +5 volts and output Q' is at 0 volts. Therefore, diodes 36 and 38 will be forward-biased, and the input signal on input 12 will pass through the input transformer 40, through diodes 36 and 38, and through the output transformer 56 to the output 16, reversed in phase.

The level of intermodulation products produced by a mixer are generally measured as either the two-tone third order intermodulation distortion level, or the third order intercept. Not a lot of detail regarding these testing methods will be provided herein, as these methods are known in the art.

The two-tone third order intermodulation distortion level is a measure of the third order products generated by a second input signal arriving at the signal input 12 of a mixer along with the desired input signal. This parameter is referred to herein as the 2A±B products. Generally, this parameter is not specified for mixers because it is dependent upon the input frequencies, terminating impedances and input levels.

The third order intercept, or Ip3, is a more convenient measure of the suppression capability of a mixer. The third order intercept point is a theoretical point on the signal input versus modulated output curve where the desired input signal and the third order intermodulation product become equal in amplitude.

Conventional diode ring mixers are limited to a third order intercept of about +16 dBm.

The following tests were performed on the trial circuit:
1. Inputs of 4.99 and 5.01 MHz, with an amplitude of −9 dBm, and a resistor value of 220 Ω, giving a current of 18 mA: Output at 2.99 and 3.01 MHz is −15 dBm 2A±B products are down by 62 dB Therefore: Ip3 is equal to −9+62/2=+22 dBm
2. Inputs of 4.99 and 5.01 MHz, increasing the amplitude by 10 dB to +1 dBm: 2A±B products are down by 39 dB Therefore: Ip3 is equal to +1+39/2=+20.5 dBm
3. Inputs of 4.99 and 5.01 MHZ, with an amplitude of −9 dBm, and decreasing the resistor value to increase the diode current to approximately 51 mA: Reduces the level of the 2A±B products to 69 dB below desired output Therefore: Ip3 is now at −9+69/2=+25.5 dBm. The test results confirm that the new mixer design performs significantly better than that known in the art. Actual levels are probably better than the test data due to the distortion in the signal analyser.

While particular embodiments of the present invention have been shown and described, it is clear that changes and modifications may be made to such embodiments without departing from the true scope and spirit of the invention. For example, the orientation of the diodes and biasing voltages in either FIG. 4 or 5 could be reversed.

Modulation in a manner of the invention could be applied to in a broad range of applications, including televisions, microwave communications, and spectrum analysers, as well as modulating radio frequency (RF) signals into intermediate frequency (IF) signals in radio receiver. One skilled in the art could also apply the teachings of this invention to a phase detector in a phase-locked loop, an electronic switch or a diode switching attenuator.

What is claimed is:

1. A double balanced mixer circuit for mixing a first input signal with a second input signal oscillating between a positive voltage and a zero voltage at a higher frequency than said first signal, and providing an output signal comprising said first input signal modulated at the frequency of said second input signal, said double balanced mixer circuit comprising:

a first solid state switching means for receiving said first input signal and said second input signal and transmitting said output signal, responsive to said second input signal having an amplitude of zero volts by being forward-biased, and coupling said first input signal to said output signal;

a second solid state switching means for receiving said first input signal and said second input signal and transmitting said output signal, responsive to a complement of said second input signal having an amplitude of zero volts by being forward-biased, and coupling an inversion of said first input signal to said output signal; and means for electrically interconnecting said first solid state switching means with said second solid state switching means so that either one of said first or said second solid state switching means being in a forward-bias state provides a low voltage potential to the other of said solid state switching means against which said other of said solid state switching means becomes reversed-bias with respect to said positive voltage.

2. A double balanced mixer circuit as claimed in claim 1, further comprising isolating means for electrically isolating said first input signal and said output signal from said second input signal.

3. A double balanced mixer circuit as claimed in claim 2, for receiving a third signal of a constant positive direct current voltage, wherein said isolating means comprises:

an input transformer having a primary winding for receiving said first input signal and a secondary winding with a balanced center tap, said balanced center tap for receiving said third input signal; and an output transformer having a first primary winding with a balanced center tap, a second primary winding with a balanced center tap and a secondary winding, said balanced center tap of said first primary winding of said output transformer for receiving said second input signal, said balanced center tap of said second primary winding of said output transformer for receiving said complement of said second input signal, and said secondary winding of said output transformer for transmitting said output signal.

4. A double balanced mixer circuit as claimed in claim 3, wherein:

said first solid state switching means comprises a first diode pair with cathodes connected to opposite ends of said secondary winding of said input transformer, and anodes connected to opposite ends of said first primary winding of said output transformer; and said second solid state switching means comprises a second diode pair with cathodes connected to opposite ends of said secondary winding of said input transformer, and anodes connected to opposite ends of said second primary winding of said output transformer.

5. A double balanced mixer circuit as claimed in claim 4, further comprising a resistance means in series with said third input signal, limiting the current from said third input signal.

6. A double balanced mixer circuit for mixing a first input signal with a second input signal at a higher frequency than said first input signal, a third input signal comprising a constant direct current (DC) voltage, and an output signal comprising said first signal modulated at the frequency of said second signal, said double balanced mixer circuit comprising:

signal generating means for receiving said second input signal and generating a square wave signal oscillating between a positive voltage and a zero voltage, and a complement of said square wave signal oscillating between said positive voltage and said zero voltage;

an input transformer having a primary winding for receiving said first input signal and a secondary winding with a balanced center tap, said balanced center tap of said input transformer for receiving said third input signal;

an output transformer having a first primary winding with a balanced center tap, a second primary winding with a balanced center tap and a secondary winding for transmitting said output signal, said balanced center tap of said first primary winding of said output transformer for receiving said square wave signal, said balanced center tap of said second primary winding of said output transformer for receiving said complement of said square wave signal;

a first diode pair with cathodes connected to opposite ends of said secondary winding of said input transformer, and anodes connected to opposite ends of said first primary winding of said output transformer; and a second diode pair with cathodes connected to opposite ends of said secondary winding of said input transformer, and anodes connected to opposite ends of said second primary winding of said output transformer.

7. A double balanced mixer circuit as claimed in claim 6 further including a resistor in series with said third input signal, limiting the current from said third input signal.

8. A double balanced mixer circuit as claimed in claim 7, wherein said signal generating means comprises a flip-flop.

9. A receiver including a mixer circuit as claimed in claim 6.

10. A transmitter including a mixer circuit as claimed in claim 6.

11. A local area wireless modem including a mixer circuit as claimed in claim 6.

12. A cable television convertor including a mixer circuit as claimed in claim 6.

13. A cellular telephone including a mixer circuit as claimed in claim 6.

14. A digital modem for coaxial cable including a mixer circuit as claimed in claim 6.

15. A digital modem for twisted pair including a mixer circuit as claimed in claim 6.

16. A printed circuit board including a mixer circuit as claimed in claim 6.

17. A double balanced mixer circuit for mixing a first input signal with a second input signal at a higher frequency than said first input signal, a third input signal comprising a constant direct current (DC) voltage, and an output signal comprising said first signal modulated at the frequency of said second signal, said double balanced mixer circuit comprising:

flip-flop means for receiving said second input signal, and generating a square wave signal oscillating between a positive voltage and a zero voltage, and a complement of said square wave signal oscillating between said positive voltage and said zero voltage;

resistance means for receiving said third input signal;

a first input transformer having a primary winding for receiving said first input signal and a secondary winding with a balanced center tap, said center tap of said first input transformer connected to said resistance means;

a first output transformer having a primary winding with a balanced center tap and a secondary winding for transmitting said output signal, said center tap of said first output transformer for receiving said second input signal;

a second output transformer having a primary winding with a balanced center tap and a secondary winding for transmitting said output signal, said center tap of said second output transformer for receiving said complement of said second input signal, a first diode pair with cathodes connected to opposite ends of said secondary winding of said input transformer, and anodes connected to opposite ends of said primary winding of said first output transformer; and a second diode pair with cathodes connected to opposite ends of said secondary winding of said input transformer, and anodes connected to opposite ends of said primary winding of said second output transformer.

* * * * *